(12) United States Patent
Mizuno et al.

(10) Patent No.: US 8,919,248 B2
(45) Date of Patent: Dec. 30, 2014

(54) SCREEN PRINTING MACHINE

(75) Inventors: Manabu Mizuno, Chiryu (JP); Tsuyoshi Mizukoshi, Chiryu (JP); Yoshimune Yokoi, Kiyosu (JP)

(73) Assignee: Fuji Machine Mfg. Co., Ltd., Chiryu-Shi (JP)

( * ) Notice: Subject to any disclaimer, the term of this patent is extended or adjusted under 35 U.S.C. 154(b) by 171 days.

(21) Appl. No.: 13/643,777

(22) PCT Filed: Apr. 25, 2011

(86) PCT No.: PCT/JP2011/060072
§ 371 (c)(1),
(2), (4) Date: Nov. 9, 2012

(87) PCT Pub. No.: WO2011/136180
PCT Pub. Date: Nov. 3, 2011

(65) Prior Publication Data
US 2013/0061766 A1    Mar. 14, 2013

(30) Foreign Application Priority Data

Apr. 27, 2010  (JP) ................................. 2010-102298
May 12, 2010  (JP) ................................. 2010-110427

(51) Int. Cl.
| B05C 17/04 | (2006.01) |
| B41F 13/20 | (2006.01) |
| H05K 3/12  | (2006.01) |
| B41F 15/08 | (2006.01) |
| H05K 3/34  | (2006.01) |

(52) U.S. Cl.
CPC .......... *H05K 3/1233* (2013.01); *B41F 15/0881* (2013.01); *H05K 3/3484* (2013.01)
USPC ............................ 101/123; 101/126; 101/479

(58) Field of Classification Search
CPC ... B41F 15/0818; B41F 13/20; B41F 13/0024
USPC .................. 101/114, 123, 124, 129, 479, 480
See application file for complete search history.

(56) References Cited

U.S. PATENT DOCUMENTS

| 4,073,232 A | 2/1978 | Brewer |
| 5,452,656 A | 9/1995 | Becher et al. |

(Continued)

FOREIGN PATENT DOCUMENTS

| CN | 1656866 A | 8/2005 |
| CN | 1907706 A | 2/2007 |

(Continued)

OTHER PUBLICATIONS

Jun. 7, 2011 International Search Report issued in International Application No. PCT/JP2011/060072.

(Continued)

*Primary Examiner* — Ren Yan
(74) *Attorney, Agent, or Firm* — Oliff PLC

(57) ABSTRACT

An improved screen printing machine is provided. The main body portion and the support table portion of the printer main body are constructed independently of each other, and the main body portion is supported by the support table portion so as to be movable forward. A feed screw is axially immovably and rotatably held by the main body portion so as to be parallel to the front and rear direction, and the feed screw is engaged with the nut provided on the support table portion. An operator rotates the handle attached to the feed screw to move the main body portion forward with respect to the support table portion so that the main body portion is drawn from the support table portion.

7 Claims, 12 Drawing Sheets

(56) References Cited

U.S. PATENT DOCUMENTS

| | | | |
|---|---|---|---|
| 6,058,835 | A | 5/2000 | Isogai et al. |
| 6,202,551 | B1 | 3/2001 | Murakami |
| 8,196,287 | B2 | 6/2012 | Awata et al. |
| 2002/0053132 | A1 | 5/2002 | Hamasaki et al. |
| 2002/0148374 | A1 | 10/2002 | Peckham et al. |
| 2005/0077143 | A1 | 4/2005 | Hamasaki et al. |
| 2005/0115060 | A1 | 6/2005 | Kondo |
| 2009/0277348 | A1 | 11/2009 | Abe et al. |
| 2010/0126363 | A1* | 5/2010 | Mizuno et al. ............... 101/126 |
| 2010/0133064 | A1* | 6/2010 | Kondo .......................... 198/349 |
| 2011/0017080 | A1 | 1/2011 | Miyahara et al. |
| 2011/0180588 | A1 | 7/2011 | Nagao |
| 2011/0197437 | A1 | 8/2011 | Nagao |
| 2012/0085254 | A1 | 4/2012 | Nagao |
| 2012/0090484 | A1 | 4/2012 | Miyahara et al. |
| 2012/0201587 | A1* | 8/2012 | Kato et al. ..................... 400/76 |

FOREIGN PATENT DOCUMENTS

| | | |
|---|---|---|
| CN | 1942059 A | 4/2007 |
| CN | 101032880 A | 9/2007 |
| CN | 101686635 A | 3/2010 |
| JP | A-62-84871 | 4/1987 |
| JP | S62-200430 | 12/1987 |
| JP | 02-207590 | 8/1990 |
| JP | 04-129630 | 4/1992 |
| JP | A-4-331151 | 11/1992 |
| JP | A-07-241977 | 9/1995 |
| JP | 10-044371 | 2/1998 |
| JP | 10-058649 | 3/1998 |
| JP | A-2000-263749 | 9/2000 |
| JP | A-2001-150631 | 6/2001 |
| JP | A-2001-326497 | 11/2001 |
| JP | A-2002-036695 | 2/2002 |
| JP | A-2002-240239 | 8/2002 |
| JP | A-2003-170564 | 6/2003 |
| JP | A-2004-104075 | 4/2004 |
| JP | 2004-142299 | 5/2004 |
| JP | 2005-081745 A | 3/2005 |
| JP | 2006-001057 | 1/2006 |
| JP | A-2006-69011 | 3/2006 |
| JP | 2006-321106 | 11/2006 |
| JP | A-2007-015307 | 1/2007 |
| JP | A-2007-38456 | 2/2007 |
| JP | A-2007-125757 | 5/2007 |
| JP | A-2009-252808 | 10/2009 |
| JP | 2010-087449 A | 4/2010 |
| JP | 2010-087450 A | 4/2010 |
| WO | WO 2009035136 A1 | 3/2009 |
| WO | WO 2009150906 A1 | 12/2009 |

OTHER PUBLICATIONS

Office Action issued in Chinese Patent Application No. 201180021130.8 dated Dec. 4, 2013 (with translation).

International Preliminary Report on Patentability issued in International Patent Application No. PCT/JP2011/060072 dated Dec. 10, 2012.

Apr. 22, 2014 Notification of Reason for Refusal issued in Japanese Patent Application No. 2010-110426 (with English Translation).

Dec. 20, 2012 International Preliminary Report on Patentability issued in International Patent Application No. PCT/JP2011/060071 (with English Translation).

Feb. 18, 2014 Office Action issued in Japanese Patent Application No. 2010-102298 (with translation).

International Search Report issued in International Patent Application No. PCT/JP2011/060071 dated May 31, 2011.

International Preliminary Report on Patentability issued in International Patent Application No. PCT/JP2011/060070 dated Dec. 10, 2012.

Chinese Office Action in Application No. 201180020686.5 mailed Dec. 2, 2013 (with English Translation).

Chinese Office Action in Application No. 2011800206884.4 mailed Dec. 3, 2013 (with English Translation).

U.S. Office Action in U.S. Appl. No. 13/643,567 mailed Feb. 13, 2014.

U.S. Office Action in U.S. Appl. No. 13/643,554 mailed Feb. 27, 2014.

Jul. 29, 2014 Notification of Second Office Action issued in Chinese Patent Application No. 201180020686.5 (with English Translation).

Aug. 12, 2014 Notification of Reason for Refusal issued in Japanese Patent Application No. 2010-245587 (with English Translation).

Aug. 12, 2014 Notification of Reason for Refusal issued in Japanese Patent Application No. 2010-110426 (with English Translation).

* cited by examiner

AT COMPLETION OF RETRACTION OF MAIN BODY PORTION AND AT START OF ITS ADVANCE

DURING ADVANCE OF MAIN BODY PORTION AND AT START OF ITS RETRACTION

DURING RETRACTION OF MAIN BODY PORTION

SCREEN PRINTING MACHINE

TECHNICAL FIELD

The present invention relates to a screen printing machine.

BACKGROUND ART

The screen printing machine includes one, as described in Patent Document 1 below, that includes: a printer main body; and a substrate conveying and supporting device and a printing device held by the printer main body.

PRIOR ART DOCUMENTS

Patent Documents

Patent Document 1: JP-A-2007-15307

SUMMARY OF THE INVENTION

Problem to be Solved by the Invention

In a conventional screen printing machine, however, there is still room for improvements. For example, a front space is required in front of the screen printing machine for an operator to perform normal operations and operations which can be performed from the front side, but a working space is often required also at a rear of the screen printing machine for e.g., maintenance. In such a case, the screen printing machine needs to be provided so as to allow a rear space in addition to the front space. This results in a larger space required, deteriorating space efficiency unfortunately.

The present invention has been developed in view of the above-described situations, and it is an object of the present invention to provide an improved screen printing machine, for example, capable of solving the above-described disadvantages.

Means for Solving Problem

The above-described problem is solved by providing a screen printing machine comprising: (a) a substrate conveying and supporting device configured to convey a circuit substrate in a right and left direction and position and support the circuit substrate at a printing position; (b) a printing device configured to carry out screen printing on the circuit substrate supported by the substrate conveying and supporting device; and (c) a printer main body configured to hold the substrate conveying and supporting device and the printing device, wherein the printer main body includes a main body portion and a support table portion which are provided independently of each other, and the main body portion is supported by the support table portion so as to be movable forward.

Effect of the Invention

The main body portion is moved forward with respect to the support table portion, whereby a space is formed over a rear portion of the support table portion and at a rear of the main body portion, allowing the operator to perform maintenance using the space, for example.

Since the screen printing machine is usually operated from the front side, it is essential to form a working space in front of the screen printing machine Where the screen printing machine is one that requires operations to be performed also from its rear side, such a machine cannot be normally placed in a state in which a rear face of the machine abuts on or is located near a wall or another machine. On the other hand, the screen printing machine having the above-described construction, the main body portion is moved forward with respect to the support table portion so as to form a space at a rear of the main body portion, and consequently the screen printing machine can be placed even if there is no working space at a rear of the machine. In other words, the front space can be utilized for the operator to perform operations from the rear side, eliminating a need to provide working space both in front of and at a rear of the screen printing machine. As a result, productivity per unit space is improved, leading to improved space efficiency.

FORMS OF THE INVENTION

There will be described by way of examples forms of inventions recognized to be claimable by the present applicant. The inventions may be hereinafter referred to as "claimable inventions", and include the invention as defined in the appended claims (which may be referred to as "the invention" or "the invention of the present application"), an invention of a concept subordinate or superordinate to the concept of the invention of the present application, and/or an invention of a concept different from the concept of the invention of the present application. The forms are numbered like the appended claims and depend on another form or forms, where appropriate. This is for easier understanding of the claimable invention, and it is to be understood that combinations of constituent elements that constitute the claimable inventions are not limited to those of the following forms. That is, the claimable inventions are to be construed by taking account of the description following each form, the description of the embodiment, the related art, the common general technical knowledge, and others, and as long as the claimable inventions are constructed in this way, any form in which one or more elements are added to or deleted from any one of the following forms may be considered as one form of the claimable invention.

(1) A screen printing machine comprising: (a) a substrate conveying and supporting device configured to convey a circuit substrate in a right and left direction and position and support the circuit substrate at a printing position; (b) a printing device configured to carry out screen printing on the circuit substrate supported by the substrate conveying and supporting device; and (c) a printer main body configured to hold the substrate conveying and supporting device and the printing device, wherein the printer main body includes a main body portion and a support table portion which are provided independently of each other, and the main body portion is supported by the support table portion so as to be movable forward.

(2) The screen printing machine according to the above form (1), a resistance reducing device is provided between the main body portion and the support table portion to reduce resistance of the movement of the main body portion relative to the support table portion.

The main body portion can be smoothly moved relative to the support table portion, which facilitates moving the main body portion and makes it possible to avoid damage due to friction between the main body portion and the support table portion being moved relative to each other. As a result, a screen printing machine with a longer useful life can be obtained. Alternatively, a guiding device which guides the movement of the main body portion relative to the support table portion may be provided and used as the resistance reducing device.

(3) The screen printing machine according to the above form (2), wherein the resistance reducing device comprises:

a first resistance-reducing portion including: a first guide fixed to the support table portion so as to be parallel to a front and rear direction; and a first engaging block provided on a rear end portion of the main body portion and engaged with the first guide so as to be movable relative to the first guide in the front and rear direction; and a second resistance-reducing portion including: a second guide fixed to the main body portion so as to be parallel to the front and rear direction; and a second engaging block provided on a front end portion of the support table portion and engaged with the second guide so as to be movable relative to the second guide in the front and rear direction.

The main body portion and the support table portion are guided by the engagements of the first and second engaging blocks and the respective first and second guides and accordingly stably positioned relative to each other before and after the movement. Also, where at least ones of the first and second engaging blocks and the first and second guides have an increased hardness and reduced surface roughness with sufficient lubrication or where the first and second engaging blocks have rolling elements such as steel balls, for example, friction of their contacting portions can be reduced. In addition, even in a state in which the main body portion has been moved to a front end position with respect to the support table portion or even in a state in which the main body portion has been moved to a rear end position with respect to the support table portion, the first and second engaging blocks are engaged with the respective first and second guides at front and rear end portions of an area in which the main body portion and the support table portion overlap each other. Thus, the main body portion is supported by the support table portion most stably, and a possible maximum load applied to the first and second engaging blocks and the first and second guides can be reduced, leading to lower manufacturing cost. The first and second resistance-reducing portions can be considered as first and second guide portions.

(4) The screen printing machine according to any one of the above forms (1) through (3), further comprising a stopper device configured to define a forward-movement end position of the main body portion with respect to the support table portion.

It is possible to prevent the main body portion from being detached from the support table portion or becoming inclined with respect to the support table portion.

(5) The screen printing machine according to the above form (4), wherein, in a state in which the main body portion has been moved to the forward-movement end position defined by the stopper device with respect to the support table portion, a center of gravity of the main body portion is located at a rear of a front end of a part of the support table portion, which part supports the main body portion.

Even in a state in which the main body portion has been moved forward through its maximum stroke, the main body portion is stably supported by the support table portion.

(6) The screen printing machine according to the above form (4), further comprising a lift-preventing device configured to prevent at least a rear portion of the main body portion from being lifted upward from the support table portion, wherein, in a state in which the main body portion has been moved to the forward-movement end position defined by the stopper device with respect to the support table portion, a center of gravity of a combination of the main body portion and the support table portion is located at a rear of a front end of a part of the support table portion, which part is held in contact with the floor surface.

The maximum forward stroke of the main body portion can be increased by utilizing the weight of the support table portion.

(7) The screen printing machine according to any one of the above forms (1) through (6), further comprising a manual drive device including: (a) a feed screw rotatably held by the main body portion so as to be parallel to the front and rear direction; (b) a handle operable to be rotated to rotate the feed screw; and (c) a nut held by the support table portion so as to be unrotatable and engaged with the feed screw, the manual drive device being configured to move the main body portion forward and backward in the front and rear direction with respect to the support table portion with a rotating operation for the handle.

The operator can easily move the main body portion. Also, since there is a limit to a speed with which the operator rotates the handle, a speed of the forward and backward movement of the main body portion is limited. Thus, impact is small upon a stop of each of the forward and backward movement, preventing the support table portion from deviating from a floor surface. Furthermore, it is prevented that the main body portion is inclined forward alone or together with the support table portion by a rotation moment due to an inertial force.

(8) The screen printing machine according to any one of the above forms (1) through (6), further comprising a power driving device including an actuator operable by power, the power driving device being configured to move the main body portion forward and backward with respect to the support table portion based on an actuation force of the actuator.

The power driving device includes an electric rotary motor, a feed screw, and a nut, for example.

The main body portion is moved by the power. Where a sensor is provided for detecting the forward-movement end position and the backward-movement end position of the main body portion, and the actuator is controlled based on a result of the detection, the user only needs to operate an operation member for instructing the forward or backward movement. A stopper device is preferably provided for defining the forward-movement end position and the backward-movement end position.

(9) The screen printing machine according to any one of the above forms (1) through (6), further comprising:

a manual drive device including: (a) a feed screw rotatably held by the main body portion so as to be parallel to the front and rear direction; (b) a handle operable to be rotated to rotate the feed screw; and (c) a nut held by the support table portion so as to be unrotatable and engaged with the feed screw, the manual drive device being configured to move the main body portion forward and backward in the front and rear direction with respect to the support table portion with a rotating operation for the handle;

a stopper device configured to define a backward-movement end position of the main body portion with respect to the support table portion; and a power driving device including an actuator operable by power, the power driving device being configured to move the main body portion backward with respect to the support table portion based on an actuation force of the actuator until the backward movement is stopped by the stopper device, wherein a clearance is formed between the nut and the support table portion so as to allow, without the rotation of the feed screw, the relative movement for a distance that is greater than a stroke through which the main body portion is moved backward by the power driving device.

The main body portion can be moved by the manual drive device. In addition, the main body portion can be always reliably positioned at the backward-movement end position by the operation of the power driving device without the operator being conscious of this operation. Also, when the main body portion is moved back by the power driving device, the feed screw is not rotated and the handle is not rotated either. Since the handle is not rotated by an amount that is greater than an amount of the rotation actually made by the operator, the operator is not given discomfort.

(10) The screen printing machine according to any one of the above forms (1) through (9), further comprising:

a movable member configured to support at least a portion of a device of the screen printing machine, the device being disposed in the main body portion; and a movable-member support device configured to support the movable member such that the movable member is movable selectively at one of an accommodating position at which the movable member is located in the main body portion; and a maintenance position at which the movable member is exposed at a rear of the main body portion.

The device in the main body portion is placed on the movable member and drawn out to a rear space that is formed by the forward movement of the main body portion. In this state, the operator can easily perform operations such as a maintenance operation. Also, the maintenance can be performed even where devices are provided near a central portion of the main body portion in the front and rear direction. Since a space in the main body portion can be used effectively, the printer can constructed more compactly, leading to further improved space efficiency.

(11) The screen printing machine according to the above form (10), wherein the movable-member support device includes:

a third guide provided in the main body portion so as to be parallel to the front and rear direction;

a fourth guide held by the third guide so as to be movable relative to the third guide in the front and rear direction, the fourth guide holding the movable member such that the movable member is movable relative to the fourth guide in the front and rear direction; and a fourth-guide moving device configured, when the movable member is drawn to the rear of the main body portion, to move the fourth guide backward with respect to the third guide through a stroke that is less than a drawing stroke of the movable member.

The fourth guide is moved rearward with respect to the third guide while guided by the third guide, and the movable member is supported by the fourth guide. This is equivalent to temporal rearward extension of the third guide. Thus, the stroke of the backward movement of the movable member can be made longer, and the movable member can be stably supported by the main body portion.

The fourth-guide moving device is preferably of an interlock type which will be described in the next form, but this is not essential. For example, the fourth-guide moving device may be constituted by two stopper devices, one of which is provided between the third guide and the fourth guide to define an amount of the movement of the fourth guide relative to the third guide, and the other of which is provided between the movable member and the fourth guide to define an amount of the movement of the movable member relative to the fourth guide.

(12) The screen printing machine according to the above form (11), wherein the fourth-guide moving device is an interlock-type fourth-guide moving device provided among the third guide, the fourth guide, and the movable member, the interlock-type fourth-guide moving device being interlocked with the movable member being drawn backward, to move the fourth guide backward with respect to the third guide by amounts each of which is half the drawing amount of the movable member.

The fourth guide is moved with respect to the third guide by half its length, and the movable member is moved with respect to the fourth guide by half its dimension in the front and rear direction. Thus, even in a state in which the movable member is moved backward through the maximum stroke of the backward movement, the fourth guide is stably supported by the third guide, and the movable member is stably supported by the fourth guide.

(13) The screen printing machine according to any one of the above forms (1) through (12), wherein a shuttle conveyor is mounted on at least one of an upstream side and a downstream side of the printer main body, the shuttle conveyor including (a) a movable conveyor configured to perform passing of the circuit substrate with the substrate conveying and supporting device and movable in a direction perpendicular to a direction in which the substrate conveying and supporting device conveys the circuit substrate and (b) a conveyor moving device configured to move the movable conveyor.

The shuttle conveyor can be used in various forms, thereby improving usability of the screen printing machine. In the screen printing machine in the present form, the printer main body can be used as a support member for supporting the shuttle conveyor, eliminating a need to provide a support member which is used only for installing the shuttle conveyor on the floor surface. Also, the substrate conveying and supporting device and the movable conveyor can be easily positioned to each other in a height direction.

The feature of the present form can be provided independently of the features of the above-described forms (1) through (12).

(14) The screen printing machine according to the above form (13), wherein the shuttle conveyor is mounted removably.

The shuttle conveyor can be mounted if needed and can be removed to shorten the line if not needed according to, for example, the structure of the screen printing machine and a type of a substrate working machine for performing a circuit-substrate-related operation such as mounting of electronic circuit components on a circuit substrate on which a printable material has been printed. Thus, a highly flexible screen printing machine can be obtained. Also, the shuttle conveyor can be removed for convenience of the maintenance operation on devices in the main body portion.

(15) The screen printing machine according to the above form (13) or (14), wherein the shuttle conveyor is mounted on the main body portion and is movable forward with respect to the support table portion together with the main body portion.

It becomes easy to perform maintenance operations on the shuttle conveyor, for example. Also, the shuttle conveyor can be removed easily in a form in which the present form depends on the form (14).

(16) The screen printing machine according to any one of the above forms (13) through (15), further comprising a heat expelling device configured to expel air in the main body portion to a lower space of the shuttle conveyor to expel heat generated in the main body portion to an outside of the main body portion.

Heat exhaustion is preferably performed even where the air generated in the main body portion cannot be expelled to a rear side, for example, even where the screen printing machine is provided along a wall face, or the screen printing machine and another machine are provided back to back.

In the lower space of the shuttle conveyor is preferably provided an air guide device, such as an air guide plate or an air guide duct, which guides the expelled air upward to reduce an amount of the heated air blowing on an adjacent device.

(17) The screen printing machine according to any one of the above forms (13) through (16), wherein an auxiliary equipment of a device in the main body portion is disposed in a lower space of the shuttle conveyor.

Effective use of the space in the shuttle conveyor can provide a more compact screen printing machine.

As the auxiliary equipment, at least one of a transformer, a vacuum producing device, and a pressurized-air producing device is preferable, for example.

EMBODIMENT

Hereinafter, there will be described one embodiment of the claimable invention by reference to the drawings. It is to be understood that the claimable invention is not limited to the embodiment described below, and may be otherwise embodied with various changes and modifications, such as those described in the foregoing "FORMS OF THE INVENTION", which may occur to those skilled in the art.

Figure 1:
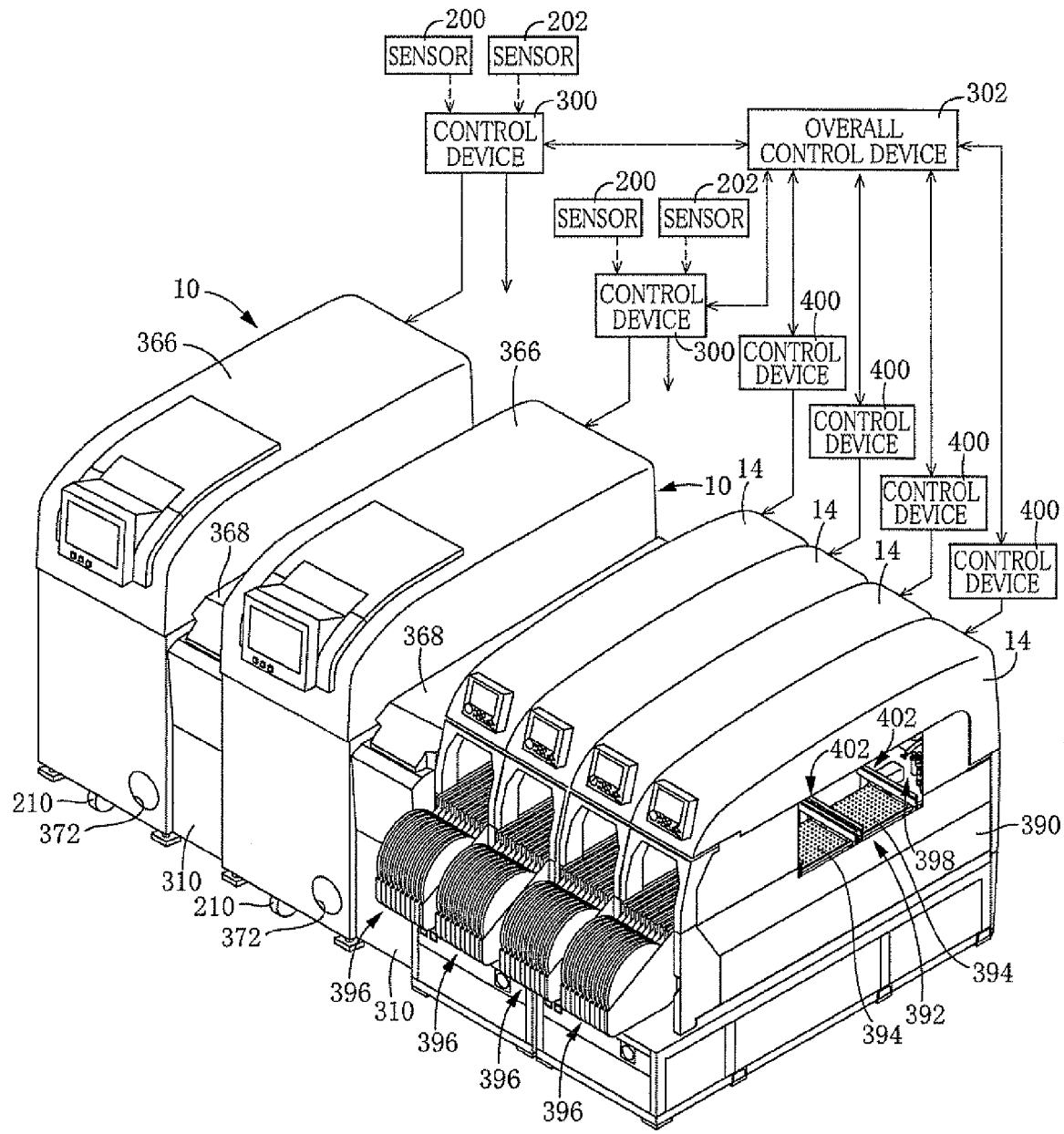
FIG. 1 is a perspective view showing an electronic-circuit assembly line that includes screen printing machines according to one embodiment.

FIG. 1 shows an electronic-circuit assembly line that includes screen printing machines according to one embodiment of the claimable invention. The present electronic-circuit assembly line includes: at least one screen printing machine 10 (hereinafter simply referred to as "printer 10"), in the present embodiment, a plurality of printers 10, for example, two printers 10; at least one electronic-circuit-component mounting machine 14 (hereinafter simply referred to as "mounting machine 14"), in the present embodiment, a plurality of mounting machines 14, for example, four mounting machines 14. Each of the printers 10 and the mounting machines 14 is one kind of a substrate working machine which performs an operation for a circuit substrate, and the electronic-circuit assembly line is one kind of a substrate working line. The two printers 10 constitute a screen printing line and are located adjacent to and upstream of the four mounting machines 14 in a circuit-substrate conveying direction in which the circuit substrate is conveyed in the electronic-circuit assembly line. The two printers 10 are arranged side by side in a right and left direction parallel to the conveying direction. In the present embodiment, the right and left direction coincides with the circuit-substrate conveying direction, and a direction perpendicular to the conveying direction coincides with a front and rear direction. In the present embodiment, each of the right and left direction and the front and rear direction is horizontal. The present electronic-circuit assembly line is provided in a state in which back faces of the printers 10 and the mounting machines 14 are along a wall face, not shown.

The two printers 10 are similar in construction to each other, and an upstream one of the printers 10 will be explained by way of example.

Figure 2:
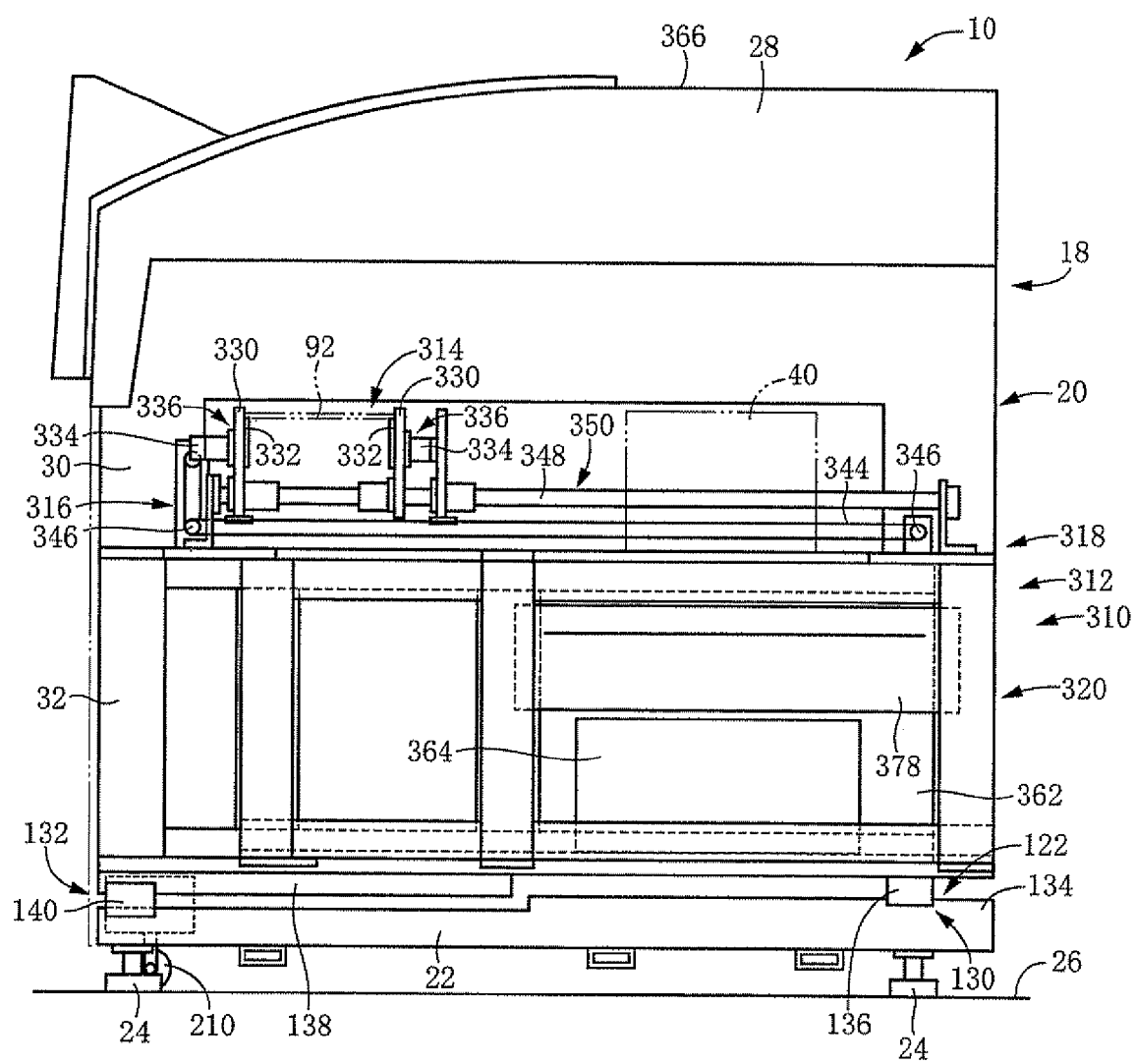
FIG. 2 is a side view showing the screen printing machine.

As shown in FIG. 2, a printer main body 18 includes a main body portion 20 and a support table portion 22 which are provided independently of each other. The main body portion 20 is supported on the support table portion 22 so as to be movable frontward. The support table portion 22 is placed on a floor surface 26 with leg portions 24 which are respectively provided on four corners of the support table portion 22.

Figure 3:
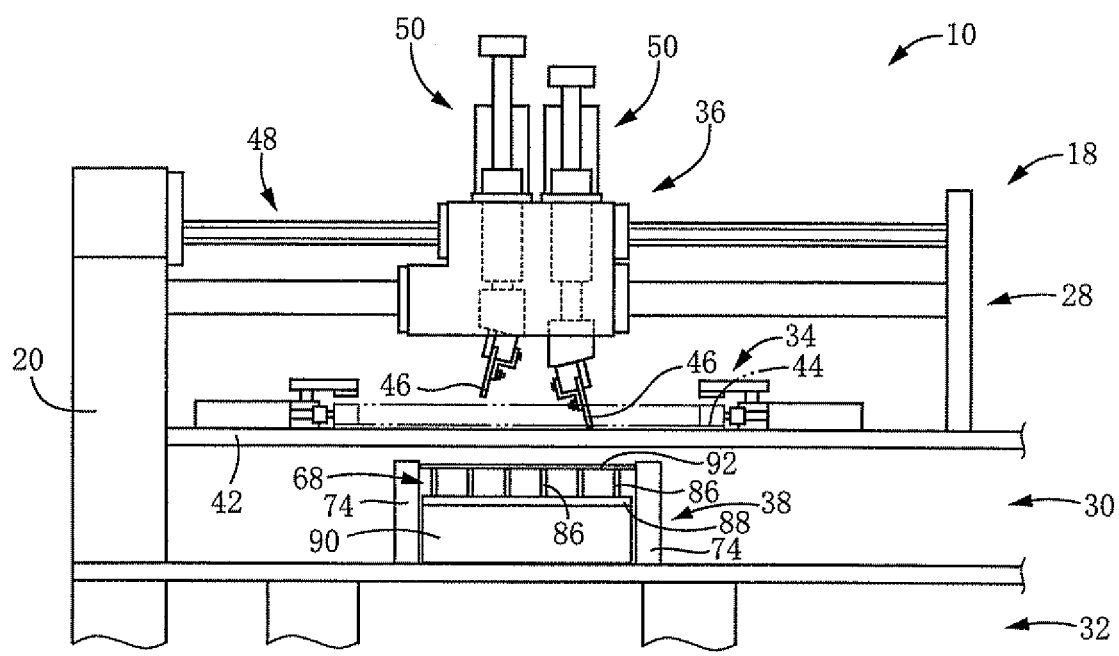
FIG. 3 is a side view showing a printing device, a mask holding device, and other devices and components of the screen printing machine.

The main body portion 20 is constituted by a plurality of components assembled together and includes a plurality of sections in its height direction, in the present embodiment, an upper section 28, a middle section 30, and a lower section 32. As shown in FIG. 3, the upper section 28 contains a mask holding device 34 and a printing device 36, and the middle section 30 contains a substrate conveying and supporting device 38 and a pass-through substrate conveyor device 40 (see FIG. 4). The mask holding device 34 holds a mask 44 placed on a mask support table 42 such that the mask 44 is in its horizontal attitude. The printing device 36 includes: a pair of squeegees 46; a squeegee moving device 48 configured to move the squeegees 46 in the front and rear direction along the mask 44; and squeegee elevating and lowering devices 50 configured to elevate and lower the respective squeegees 46 such that the squeegees 46 are brought into contact with and spaced apart from the mask 44.

Figure 4:
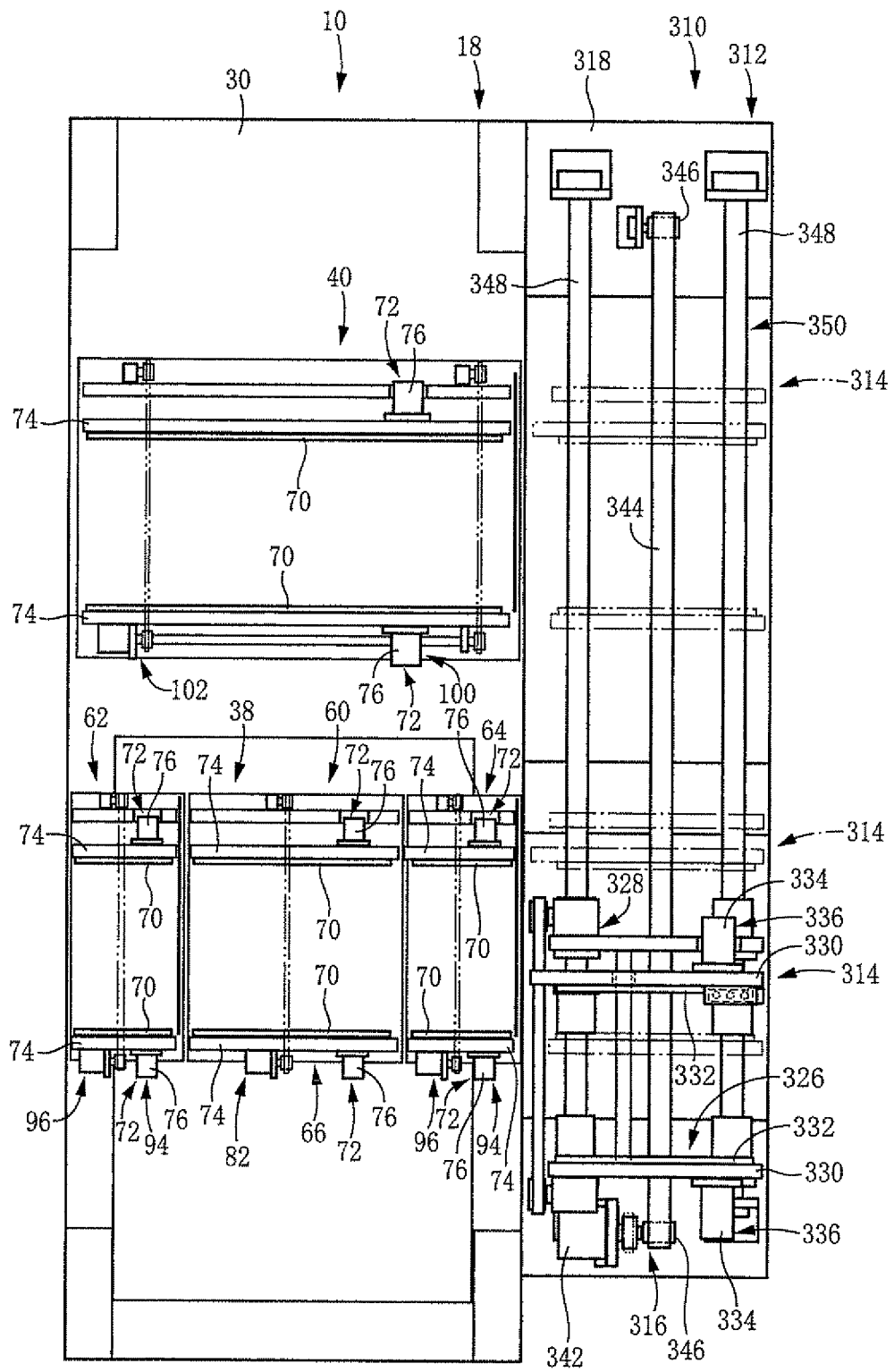
FIG. 4 is a plan view showing a substrate conveying and supporting device of the screen printing machine and a shuttle conveyor.

As shown in FIG. 4, the present substrate conveying and supporting device 38 is provided in a front portion of the middle section 30 and includes: a main conveyor 60; an in-conveyor 62 disposed upstream of the main conveyor 60 in the conveying direction; and an outconveyor 64 disposed downstream of the main conveyor 60 in the conveying direction. The main conveyor 60 includes a conveyor device 66 and a substrate support device 68. The conveyor device 66 is constituted by a belt conveyor in the present embodiment and includes: a pair of conveyor belts 70; and belt rotating devices 72 configured to rotating the respective conveyor belts 70. The pair of conveyor belts 70 are rotatably supported by side frames 74, respectively. The conveyor belts 70 are rotated synchronously with each other by the respective belt rotating devices 72 each including a rotation motor 76 as a drive source. These rotations cause the circuit substrate to be conveyed with its printing surface being horizontal.

The main conveyor 60 is provided with a stopper device, not shown, which stops and positions the circuit substrate at a predetermined printing position. A conveyor width with which the conveyor device 66 conveys the circuit substrate is automatically changed by a conveyor-width changing device 82. As schematically shown in FIG. 3, the substrate support device 68 in the present embodiment includes: a plurality of support pins 86 each as a support member; a pin support table 88; and a support-table elevating and lowering device 90 and supports a circuit substrate 92 from the lower side thereof. In the present embodiment, the substrate support device 68 and the conveyor device 66 cooperate to constitute a substrate clamping device, whereby when the main conveyor 60 is elevated and lowered by an elevating and lowering device, not shown, the circuit substrate 92 is brought into contact with and spaced apart from a lower face of the mask 44.

Like the main conveyor 60, each of the in-conveyor 62 and the outconveyor 64 includes a conveyor device 94 and a conveyor-width changing device 96 (see FIG. 4). It is noted that the same reference numerals will be used for functionally corresponding elements to identify their correspondences, and an explanation thereof will be omitted.

As shown in FIG. 4, the pass-through substrate conveyor device 40 is provided on a rear portion of the middle section 30 and includes a conveyor device 100 and a conveyor-width changing device 102 like the conveyors 62, 64. The conveyor device 100 is constituted by a belt conveyor and provided parallel to the conveyors 62, 64 so as to extend from one to the other end of the printer 10 in the conveying direction. It is noted that the same reference numerals as used in the conveyors 62, 64 will be used for functionally corresponding elements of the pass-through substrate conveyor device 40 to identify their correspondences, and an explanation thereof will be omitted.

In the present printer 10, the main body portion 20 of the printer main body 18 is moved forward and backward in the front and rear direction with respect to the support table portion 22 by an operator operating a manual drive device 120. A resistance reducing device 122 reduces resistance of this movement of the main body portion 20 relative to the support table portion 22.

As shown in FIG. 2, the present resistance reducing device 122 includes a first resistance-reducing portion 130 and a second resistance-reducing portion 132. The first resistance-reducing portion 130 includes: a pair of guides 134 provided on the support table portion 22; and a pair of engaging blocks 136 provided on the main body portion 20. The guides 134 each in the form of a rail are respectively fixed on opposite end portions of a rear portion of an upper face of the support table portion 22 which are spaced apart from each other in the right and left direction, such that the guides 134 are parallel to the front and rear direction. The pair of engaging blocks 136 are respectively fixed on opposite end portions of a rear end portion of a lower face of the main body portion 20 which are spaced apart from each other in the right and left direction.

The second resistance-reducing portion 132 includes: a pair of guides 138 provided on the main body portion 20; and a pair of engaging blocks 140 provided on the support table portion 22. The guides 138 each in the form of a rail are respectively fixed on opposite end portions of a front portion of the lower face of the main body portion 20 which are spaced apart from each other in the right and left direction, such that the guides 138 are parallel to the front and rear direction. The engaging blocks 140 are respectively fixed on opposite end portions of a front end portion of the upper face of the support table portion 22 which are spaced apart from each other in the right and left direction.

The engaging blocks 136, 140 are fitted on the respective guides 134, 138 so as to be movable relative to the respective guides 134, 138 in the front and rear direction. In the present embodiment, each of the engaging blocks 136, 140 holds a plurality of steel balls, not shown, along a recirculating track such that the steel balls can be recirculated. Using some of these steel balls, each of the engaging blocks 136, 140 is engaged with guide grooves which are respectively formed in a pair of side faces of a corresponding one of the guides 134, 138 and which extend in the front and rear direction. The engaging blocks 136, 140 not only support a load of the main body portion 20 but also prevent the main body portion 20 from being lifted or floating from the support table portion 22 if an external force is applied to the main body portion 20 due to some reasons. In the present embodiment, the plurality of steel balls and the guide grooves of the guides 134, 138 constitute a lift-preventing device. A structure of the lift-preventing device is well known, and a drawing and an explanation thereof is omitted.

Figure 5:
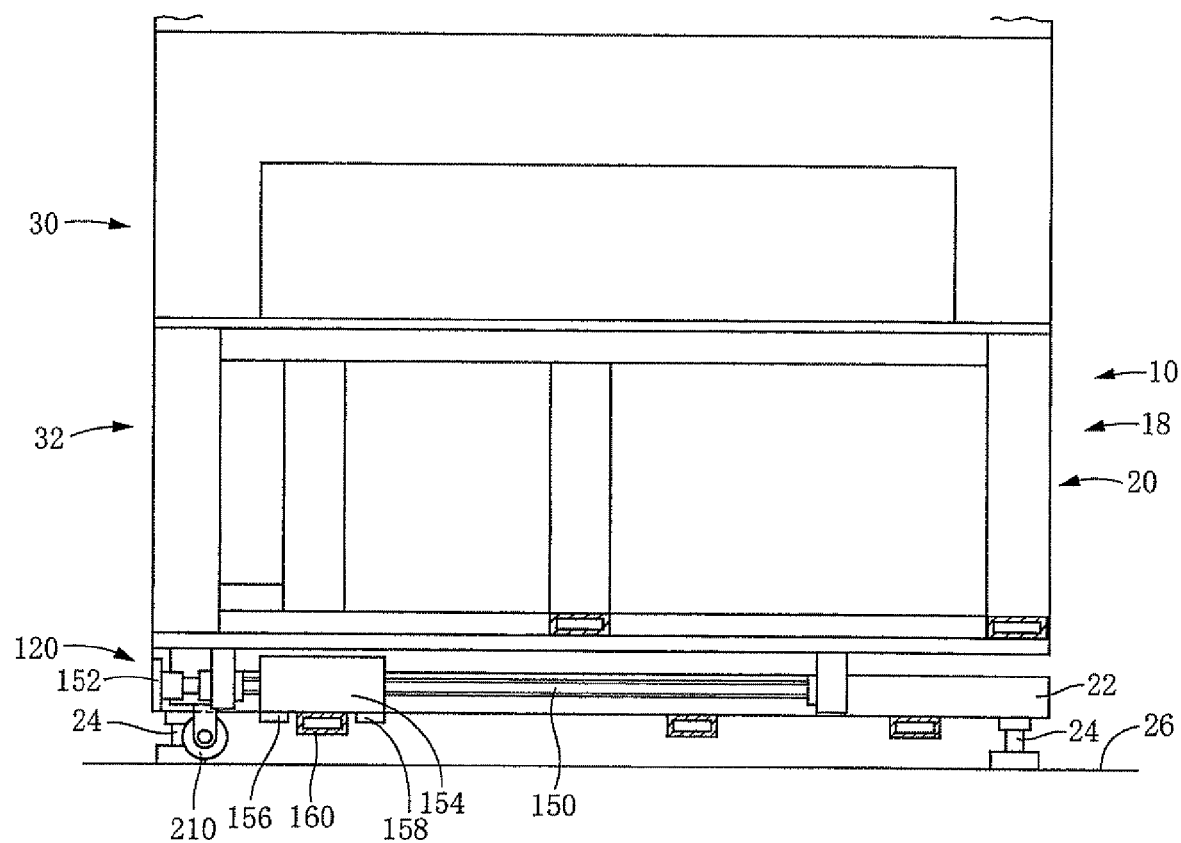
FIG. 5 is a side view showing a printer main body of the screen printing machine.

As shown in FIG. 5, the manual drive device 120 includes a feed screw 150, a handle 152, and a nut 154. The feed screw 150 is axially immovably and rotatably mounted on a front portion of the lower face of the main body portion 20 so as to be parallel to the front and rear direction. The feed screw 150 extends such that its front end portion is located near a front end portion of the main body portion 20, and the handle 152 is attached to the front end portion of the feed screw 150.

As shown in FIG. 5, the nut 154 is provided on a front portion of the support table portion 22. The nut 154 holds a plurality of steel balls and is engaged with the feed screw 150 so as to constitute a ball screw mechanism together with the feed screw 150. In the present embodiment, the nut 154 is provided with protruding portions 156, 158 at two portions of a lower face of the nut 154 which are spaced apart from each other in the front and rear direction, and these protruding portions 156, 158 constitute an engaging portion. The nut 154 is provided in a state in which the protruding portions 156, 158 are respectively located on front and rear sides of an engaging portion 160 provided on the support table portion 22. The engaging portion 160 is constituted by a beam member of the support table portion 22 which extends in the right and left direction. A distance between the protruding portions 156, 158 is greater than a length of the engaging portion 160 in the front and rear direction, and as shown in FIG. 6, clearance is formed between the nut 154 and the support table portion 22 in the front and rear direction.

The clearance between the nut 154 and the engaging portion 160 is small in the up and down direction, thereby preventing the nut 154 from rotating relative to the support table portion 22 about an axis that is parallel to the front and rear direction. When one of the protruding portions 156, 158 is engaged with the engaging portion 160, the nut 154 is inhibited from moving relative to the support table portion 22. When the handle 152 is rotated in this state, the feed screw 150 is rotated and the nut 154 is moved in its axial direction, whereby the main body portion 20 is moved forward and backward with respect to the support table portion 22. A reason for providing the clearance will be explained later. The support table portion may be provided with a pair of engaging portions, and the nut may be provided with an engaging portion that is selectively engaged with one of the pair of engaging portions.

Figure 7:
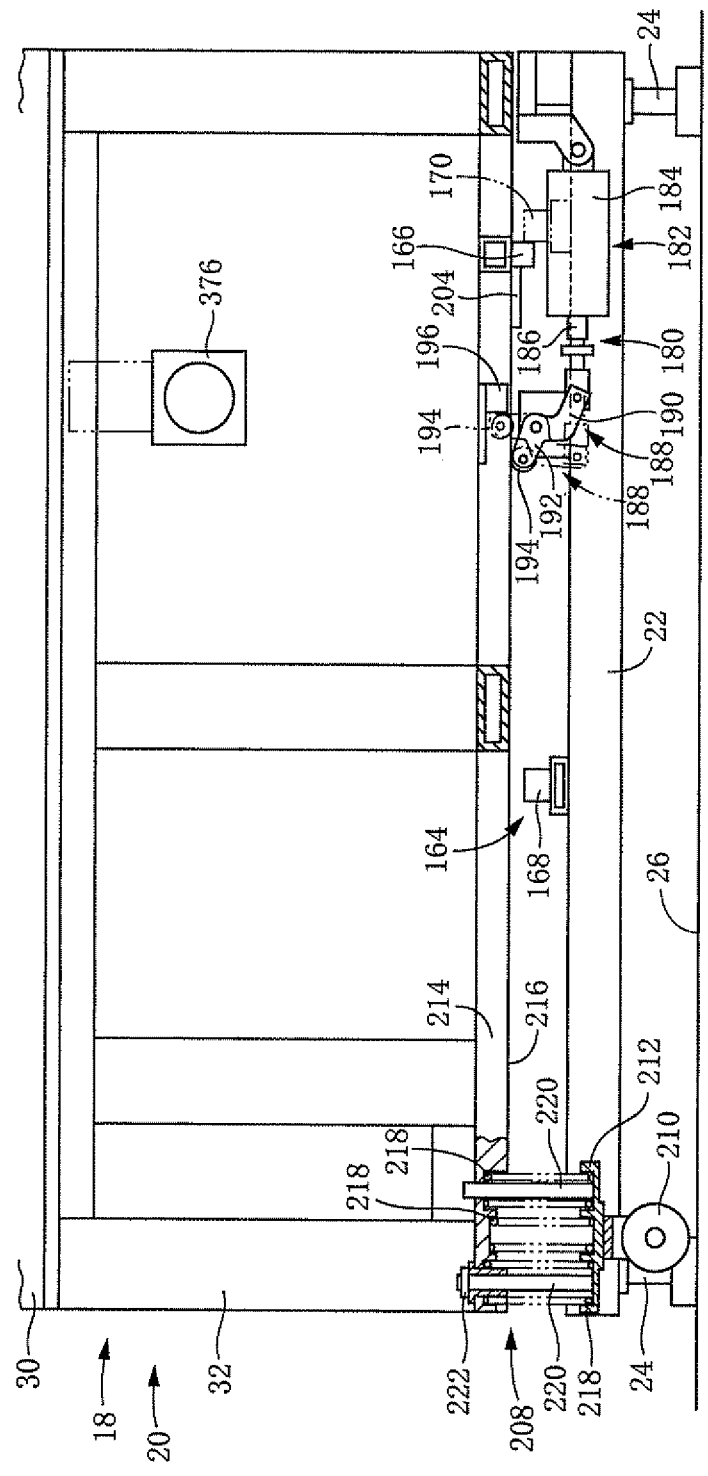
FIG. 7 is a side view showing a wheel device and a retracting device of the screen printing machine (partially in cross section).

A forward-movement end position and a backward-movement end position of the main body portion 20 with respect to the support table portion 22 is defined by a stopper device 164 shown in FIG. 7. In the present embodiment, the stopper device 164 includes: a main-body-portion-side stopper portion 166 in the form of a protruding portion that projects downward from the lower face of the main body portion 20; and a pair of support-table-portion-side stopper portions 168, 170 each in the form of a protruding portion that projects upward from the upper face of the support table portion 22. The support-table-portion-side stopper portions 168, 170 are provided spaced apart from each other in the front and rear direction. Contact of the main-body-portion-side stopper portion 166 with the front support-table-portion-side stopper portion 168 defines the forward-movement end position of the main body portion 20 while contact of the main-body-portion-side stopper portion 166 with the rear support-table-portion-side stopper portion 170 defines the backward-movement end position of the main body portion 20.

In the present embodiment, the front support-table-portion-side stopper portion 168 is provided at a position where, in a state in which the main body portion 20 has been moved to the forward-movement end position with respect to the support table portion 22, a center of gravity of the main body portion 20 is located at a rear of a front end of a part of the support table portion 22, which part supports the main body portion 20. On the other hand, as shown in FIG. 7, the rear support-table-portion-side stopper portion 170 is provided at such a position that a position of the main body portion 20 fully retracted on the support table portion 22 is the backward-movement end position.

In the present embodiment, as shown in FIG. 7, a retracting device 180 as a power driving device is provided to automatically position the main body portion 20 at the backward-movement end position. The present retracting device 180 includes an air cylinder 182 as a drive source. This air cylinder is one kind of a fluidic cylinder as a fluidic actuator and operated by power in the form of a compression air. In the present embodiment, the air cylinder 182 is a single-acting cylinder in which a piston is urged in its backward direction by an elastic member, not shown. The air cylinder 182 includes a cylinder housing 184 whose one end portion is attached to the support table portion 22 such that the cylinder housing 184 is pivotable. A lever 188 as an engaging member is attached to a distal end portion of a piston rod 186. The lever 188 is pivotably attached to the support table portion 22, and an arm portion 190 extending from a pivotal axis of the lever 188 is connected to the piston rod 186. Another arm portion 192 extends from the pivotal axis of the lever 188 in a direction away from the arm portion 190, and a roller 194 is rotatably attached to a distal end portion of the arm portion 192 so as to constitute a rotational engaging portion as an engaging portion.

As shown in FIG. 7, an engaging protruding portion 196 is provided on a lower end portion of the main body portion 20 so as to constitute an engaged portion. The lever 188 is pivoted by reciprocation of the piston rod 186 so as to be selectively moved to one of a retracted position indicated by solid lines where the roller 194 is positioned under a moving path of the engaging protruding portion 196 to allow its forward and backward movement; and an operative position indicated by two-dot chain lines where the roller 194 is located in the moving path so as to be engaged with the engaging protruding portion 196 to move the main body portion 20 backward. It is noted that the retracting device 180 and the engaging protruding portion 196 are different from the stopper device 164 in position in the right and left direction.

The air cylinder 182 is operated based on an output signal outputted from a sensor 200 (see FIG. 1) which is provided on the support table portion 22, and the operation of the air cylinder 182 is stopped based on an output signal outputted from a sensor 202 (see FIGS. 1 and 6). Each of the sensors 200, 202 is a transmission-type photoelectric sensor as a photoelectric sensor as one kind of a noncontact sensor, for example, and outputs different signals according to the presence or absence of light reception of a light receiving portion.

In the present embodiment, the main-body-portion-side stopper portion 166 inhibits the light receiving portion of the sensor 200 from receiving light, so that the signal is changed from "ON" to "OFF". Based on this change, the compression air is supplied to the air cylinder 182, whereby the lever 188 is pivoted to the operative position. Thus, the sensor 200 and the engaging protruding portion 196 are provided at such positions that, in a state in which a distance between the main-body-portion-side stopper portion 166 and the rear support-table-portion-side stopper portion 170 is shorter than an operating stroke of the roller 194, the roller 194 can be engaged with a front end face of the engaging protruding portion 196 to push the main body portion 20 rearward and continue pushing the main body portion 20 even in the state in which the main body portion 20 is positioned at the backward-movement end position. The main-body-portion-side stopper portion 166 is provided with a projection 204 which projects frontward from a front end of the main-body-portion-side stopper portion 166, and this projection 204 constitutes a detected portion together with the main-body-portion-side stopper portion 166. Even in the state in which the main body portion 20 has been moved to the backward-movement end position, the light reception of the light receiving portion is inhibited. Thus, the main body portion 20 is kept at the backward-movement end position by the operation of the air cylinder 182.

Figure 6A:
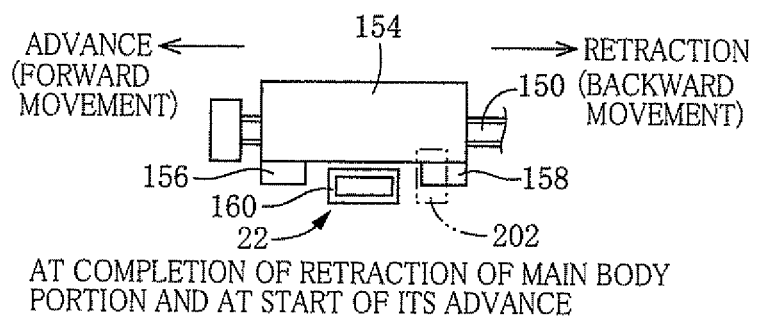
FIGS. 6A-6C are views for explaining movement of a nut of a manual drive device when a main body portion of the printer main body is advanced and retracted with respect to a support table portion of the printer main body.
Figure 6B:
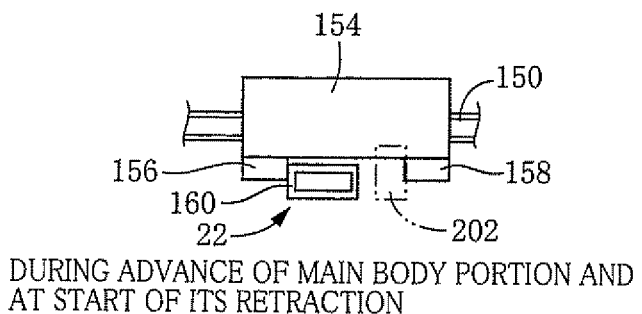

The sensor 202 is provided at a position where its output signal is changed according to a size of the clearance between the rear protruding portion 158 of the nut 154 and the engaging portion 160 on the support table portion 22. The clearance is formed between each of the protruding portions 156, 158 and the engaging portion 160 as shown in FIG. 6A in the state in which the main body portion 20 is positioned at the backward-movement end position, but as will be explained later, when the main body portion 20 is advanced or drawn from the support table portion 22, the nut 154 is moved rearward with respect to the feed screw 150, and the protruding portion 156 is engaged with the engaging portion 160, so that the clearance between the protruding portion 158 and the engaging portion 160 is made larger and becomes the largest as shown in FIG. 6B. Thus, the sensor 202 is provided at a position where the light reception of the light receiving portion is inhibited and the sensor 202 outputs the OFF signal in the state in which the main body portion 20 is positioned at the backward-movement end position and the clearance is shorter than its maximum length, and the light receiving portion becomes its light receiving state and the sensor 202 outputs the ON signal before the clearance becomes the largest.

Based on the change of the output signal of the sensor 202 from "OFF" to "ON", an air chamber of the air cylinder 182 becomes open to atmosphere, and the lever 188 is pivoted to the retracted position, allowing the main body portion 20 to move forward with respect to the support table portion 22. In the present embodiment, the sensor 202 constitutes a stop command device which commands the retracting device 180 to stop its operation. The stop command device may be constituted by a switch operable by the operator. In this case, the operator operates the switch, before the main body portion 20 is advanced from the support table portion 22, to instruct the control device to stop its operation so that the air chamber of the air cylinder 182 is open to the atmosphere.

As shown in FIG. 7, the main body portion 20 is provided with a wheel device 208. The wheel device 208 includes a wheel 210 and a wheel holder 212 and is mounted on a lower face 216 of a front end portion of a bottom wall 214 of the main body portion 20. The wheel holder 212 holds the wheel 210 rotatably and is urged in a direction away from the main body portion 20 by compression coil springs 218 each as an elastic member disposed between the wheel holder 212 and the bottom wall 214. The springs 218 may be at least one spring, in the present embodiment, three springs 218 are provided, for example. Two of the three springs 218 are respectively fitted on guide rods 220 each of which guides elevation and lowering of the wheel holder 212. The guide rods 220 having a rod-like shape projects from the wheel holder 212 and extends through the bottom wall 214 so as to be movable in the up and down direction. A maximum distance between the main body portion 20 and the wheel holder 212 which are moved away from each other by the urge of the springs 218 is defined by engagement of engaging portions 222 provided on upper end portions of the respective guide rods 220 with an upper face of the bottom wall 214. Loads are applied to the springs 218 in advance. In the present embodiment, the engaging portions 222 are provided such that the wheel 210 is slightly distant from the floor surface 26 in a state in which the engaging portions 222 are engaged with the bottom wall 214. Instead of or in addition to being provided between the wheel holder and the main body portion, the elastic member may be provided between the wheel and the wheel holder.

Figure 8:
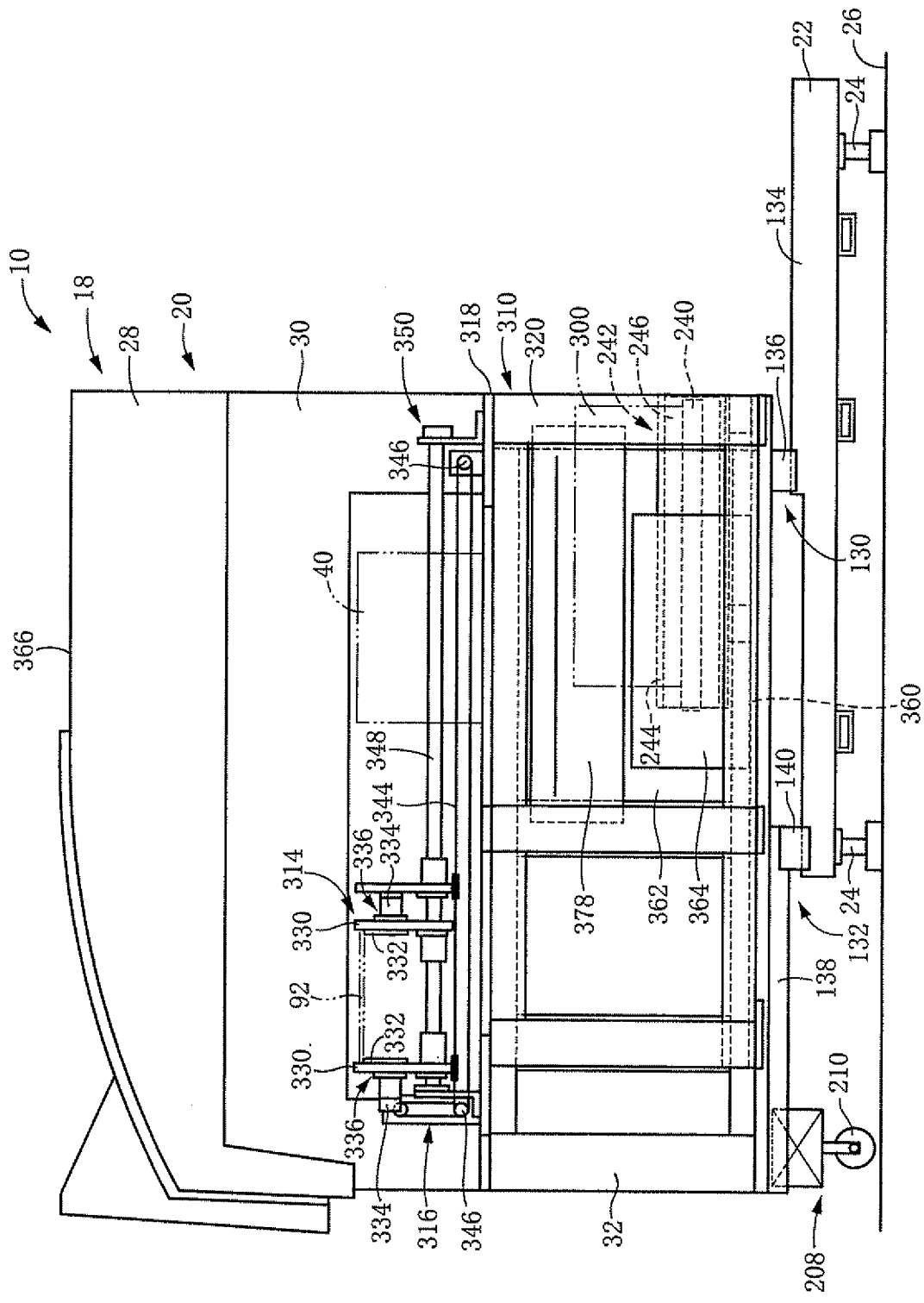
FIG. 8 is a side view showing a state in which the main body portion is advanced from the support table portion, and a movable table is located at an accommodating position.
Figure 10:
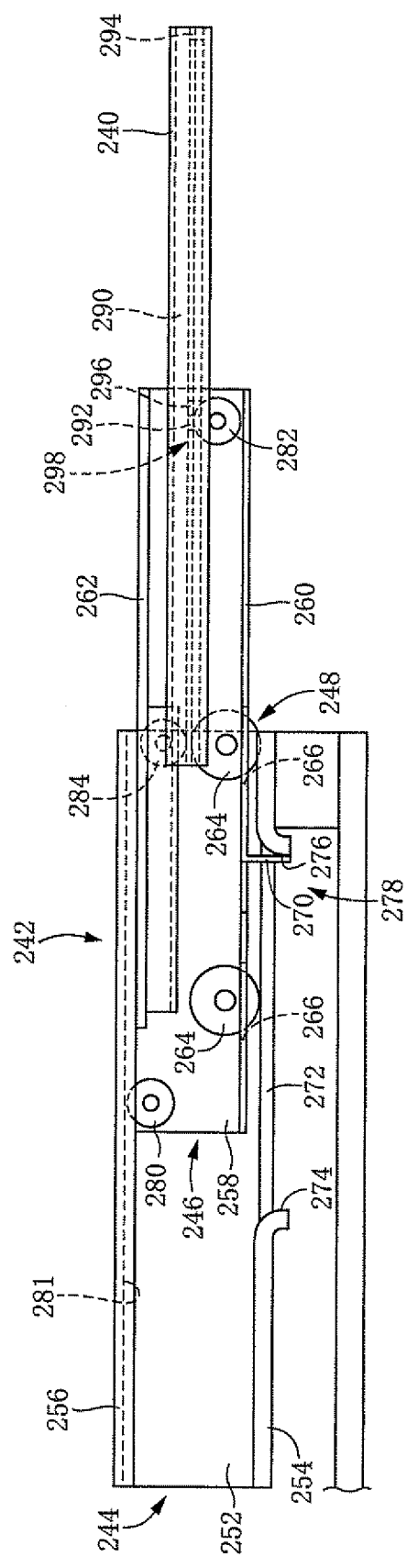
FIG. 10 is a side view showing one side of each of the movable table and a movable-table support device.
Figure 11:
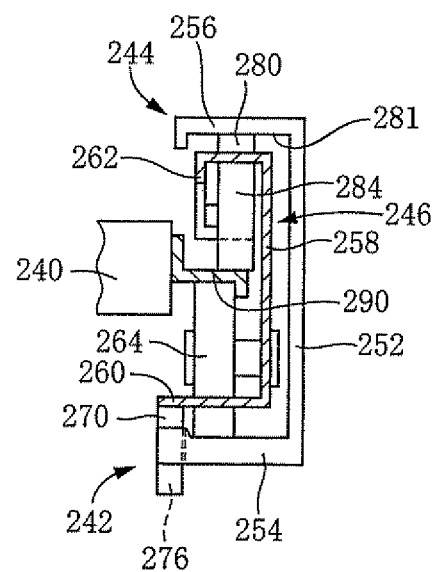
FIG. 11 is a rear view showing two guides of the movable-table support device (partially in cross section).

As shown in FIG. 8, the lower section 32 of the main body portion 20 contains: a movable table 240 as a movable member; and a movable-table support device 242 as a movable-member support device. As shown in FIG. 10, the movable-table support device 242 includes: a pair of guides 244 provided in a lower portion of the lower section 32 so as to be parallel to the front and rear direction; another pair of guides 246 held by the respective guides 244; and an interlock-type guide moving device 248 which moves the guides 246 backward with respect to the guides 244. FIG. 8 shows one of the guides 244 and one of the guides 246. The pair of guides 244 are provided spaced apart from each other in the right and left direction and each is an elongated member. As shown in FIG. 11, each of the pair of guides 244 includes: a side plate portion 252 provided fixedly and vertically in the lower section 32; a rail portion 254 projecting perpendicularly from a lower end portion of the side plate portion 252; and an engaging portion 256 projecting from an upper end portion of the side plate portion 252.

Figure 12:
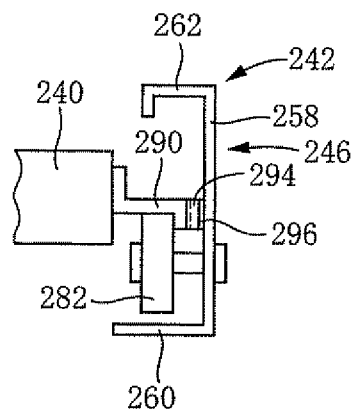
FIG. 12 is a rear view showing a state in which the movable table is guided by a roller provided on one of the two guides.

Each of the pair of guides 246 is an elongated member and as shown in FIG. 12 includes: a side plate portion 258 provided vertically; a rib 260 projecting perpendicularly from a lower end portion of the side plate portion 258; and a holding portion 262 having an L shape in transverse cross section and projecting from an upper end portion of the side plate portion 258. As shown in FIG. 10, two rollers 264 are rotatably attached at a front portion of a lower portion of the side plate portion 258 so as to be spaced apart from each other in the front and rear direction. These rollers 264 projects at their lower portions toward a lower side of the rib 260 respectively through openings 266 formed in the rib 260 and are placed on the rail portion 254 of the guide 244 such that the rollers 264 can roll thereon. The guides 246 are held by the respective guides 244 so as to be movable relative to the respective guides 244 in the front and rear direction. From each of the ribs 260, a stopper portion 270 is projected downward and fitted in a cutout 272 that is formed in the rail portion 254 so as to extend in the front and rear direction, and the stopper portion 270 can be brought into contact with a front end face 274 and a rear end face 276 of the cutout 272, which limits the movement of the guide 246 relative to the guide 244. The stopper portion 270 and the end faces 274, 276 constitute a stopper device 278 which limits an amount of the movement of the guide 246 relative to the guide 244 to about half a length of the guide 246.

As shown in FIG. 10, a roller 280 is rotatably attached to an upper portion of a front end portion of each side plate portion 258. This roller 280 is fitted in a groove 281 provided in the engaging portion 256 of the guide 244. A roller 282 is rotatably attached to a lower portion of a rear end portion of each side plate portion 258, and a roller 284 is held by the holding portion 262 at its intermediate portion in the front and rear direction so as to be rotatable and movable relative to the holding portion 262 in the front and rear direction. The movement of the roller 284 is limited by a stopper portion, not shown, provided on the holding portion 262, and the roller 284 is moved between the two rollers 264.

Rails 290 are respectively provided on opposite side faces of the movable table 240 which are spaced apart from each other in the right and left direction (FIG. 10 shows one of the rails 290). Each of the rails 290 extends in the front and rear direction, and as shown in FIGS. 11 and 12 the rail 290 is placed and supported on the rollers 264, 282 of the guide 246. Protruding portions 292, 294 project respectively from a rear end portion of the rail 290 and a portion of the rail 290 which is spaced apart from the rear end portion in the front direction. The protruding portions 292, 294 can be brought into contact with a protruding portion 296 projecting from the side plate portion 258, which defines a forward-movement end position and a backward-movement end position of the movable table 240 with respect to the guides 246. The protruding portions 292, 294, 296 constitute an engaging portion and constitute a stopper device 298 which limits an amount of the movement of the movable table 240 relative to the guides 246 to about half a dimension of the movable table 240 in the front and rear direction. In the present embodiment, the interlock-type guide moving device 248 is constituted by the stopper device 278, 298 and the rollers 264, 282 which constitute a rotational support member.

Placed on the movable table 240 is a device of the printer 10 such as a control device 300, as one kind of electric components, for controlling the printer 10. The control device 300 is mainly constituted by a computer and controls, for example, drive sources for various devices of the printer 10. Many of motors as the drive sources in the present printer 10 are each constituted by a servomotor, as one kind of an electric motor, which is a rotary electric motor capable of accurately controlling its rotation angle. Each of the motors may be constituted by a linear motor. The control device 300 is controlled in a coordinated manner by an overall control device 302 (see FIG. 1) which controls the overall electronic-circuit assembly line. The overall control device 302 is mainly constituted by a computer.

Figure 13:
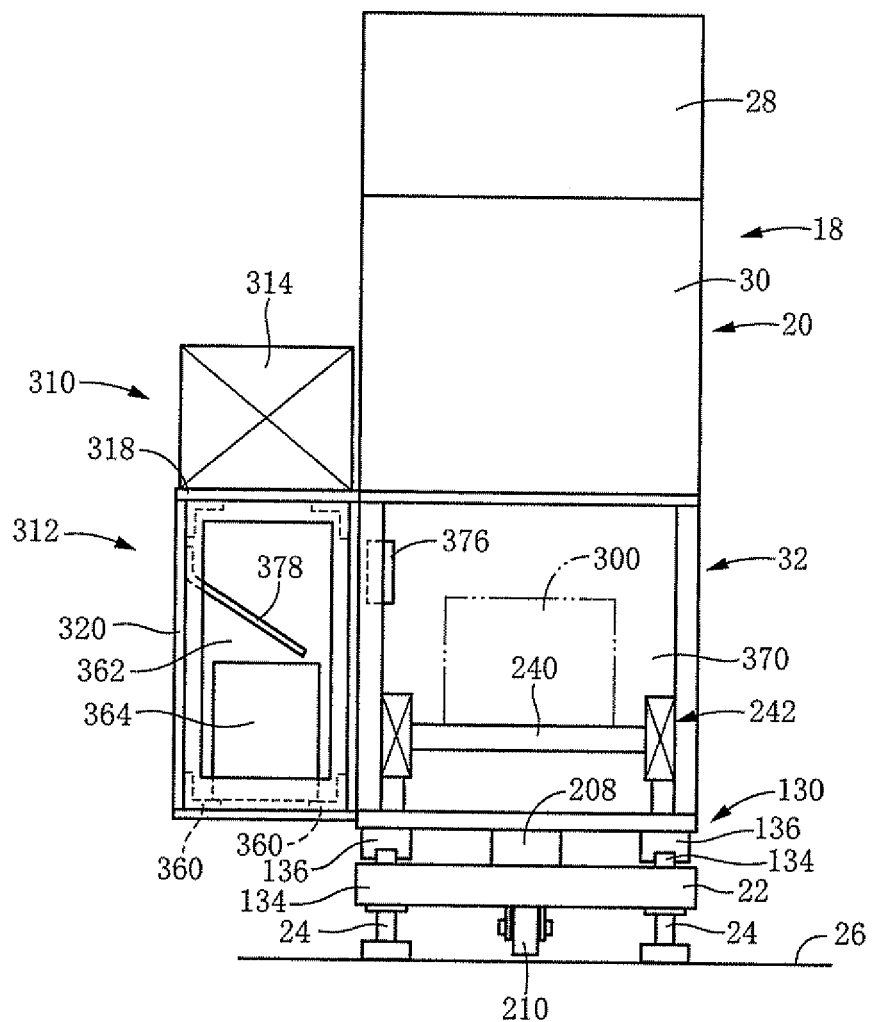
FIG. 13 is a rear view showing the screen printing machine.

As shown in FIGS. 4 and 13, a shuttle conveyor 310 is mounted on a downstream side of the main body portion 20 of the present printer 10. The present shuttle conveyor 310 includes a conveyor main body 312, a movable conveyor 314, and a conveyor moving device 316. As shown in FIG. 2, the conveyor main body 312 is constituted by a plurality of components assembled so as to have a frame shape and is divided into a plurality of sections in height, for example, an upper section 318 and a lower section 320. The conveyor main body 312 is secured to a downstream side face of the main body portion 20 by a plurality of bolts, not shown, and the operator can loosen the bolts to demount the conveyor main body 312 from the main body portion 20. As shown in FIG. 13, the shuttle conveyor 310 is mounted on the main body portion 20 in a state in which the shuttle conveyor 310 floats above the floor surface 26.

As shown in FIG. 4, the movable conveyor 314 is provided in the upper section 318 and includes a conveyor device 326 and a conveyor-width changing device 328. The conveyor device 326 is similar in construction to the conveyor device 94 of each of the conveyors 62, 64 and includes: conveyor belts 332 respectively supported by a pair of side frames 330; and belt rotating devices 336 each using a rotation motor 334 as a drive source to rotate a corresponding one of the conveyor belts 332.

As shown in FIG. 4, the conveyor moving device 316 includes: a shuttle motor 342 as a drive source; a belt 344; and a plurality of pulleys 346. The belt 344 is a timing belt and the pulleys 346 are timing pulleys. One of the plurality of pulleys 346 is rotated by the shuttle motor 342 to move the belt 344. As a result, the pair of side frames 330 are moved together with the conveyor-width changing device 328 while guided by a guiding device 350 that includes a pair of guide rods 348. The movable conveyor 314 can be moved to any position in the front and rear direction and, as indicated by one-dot chain lines and two-dot chain lines in FIG. 4, positioned selectively at one of positions continuous to the conveyor on an upstream or a downstream side thereof to pass and/or receive the circuit substrate. The shuttle conveyor 310 is controlled by the control device 300.

As shown in FIG. 13, a plurality of flooring materials 360 are installed on the lower section 320 of the conveyor main body 312. An auxiliary equipment in the main body portion 20, in the present embodiment, a transformer 364 is disposed in a lower space 362 which is a space in the lower section 320. As shown in FIG. 1, the printer main body 18 and the conveyor main body 312 are respectively covered with housings 366, 368. Each of the housings 366, 368 has openings at positions located downstream and upstream of the printer 10 for the pass and receipt of the circuit substrate, whereby a lower space 370 which is a space in the lower section 32 and the lower space 362 of the shuttle conveyor 310 are continuous to each other, allowing use of the auxiliary equipment of the printer 10 with the auxiliary equipment placed in the shuttle conveyor 310. A front face of the housing 366 has an opening 372 shown in FIG. 1 through which the operator inserts his or her hand to operate the handle 152.

As shown in FIG. 13, a fan 376 as one kind of a heat expelling device is attached to an upper part of a portion of the lower section 32 of the main body portion 20, which portion abuts on the shuttle conveyor 310. The fan 376 is provided to expel heat generated in the main body portion 20 to an outside of the main body portion 20, in the present embodiment, to the lower space 362 of the shuttle conveyor 310 mounted on the main body portion 20. An air guide plate 378 is provided in the lower space 362. The air guide plate 378 is provided in an upper portion of the lower space 362 so as to incline downward in a direction toward the main body portion 20 and not to interfere with the auxiliary equipment placed in the lower space 362. Air transferred by the fan 376 is guided upward by the air guide plate 378 and expelled through an exhaust opening which is formed in a top portion of the housing 368. This prevents the heated air discharged from the main body portion 20 from blowing on the downstream printer 10 or the mounting machine 14 or from colliding with air expelled from an adjacent device.

In the present embodiment, each of the four mounting machines 14 is similar in construction to each electronic-circuit-component mounting machine disclosed in JP-A-2004-104075 and is designed in modules. As partly shown in FIG. 1, each of the four mounting machines 14 includes a mounting-machine main body 390, a substrate conveyor device 392, substrate support devices 394, a component supplying device 396, a component mounting device 398, and a control device 400. The four mounting machines 14 cooperate to mount electronic circuit components onto a single circuit substrate in parallel. The substrate conveyor device 392 includes a pair of conveyors 402. These conveyors 402 are arranged next to each other in the front and rear direction of the mounting-machine main body 390 so as to be parallel to each other. Each of the conveyors 402 is constituted by a belt conveyor in the present embodiment, and its conveyor width is automatically adjusted by a conveyor-width changing device, not shown. The substrate support devices 394 are provided on each of the two conveyors 402. The circuit substrate conveyed by any of the conveyors 402 is supported on a corresponding one of the substrate support devices 394, and the electronic circuit components are mounted. The control device 400 is mainly constituted by a computer and controlled by the overall control device 302 in a coordinated manner.

In the electronic-circuit assembly line constructed as described above, the two printers 10 print a printable material, in the present embodiment, solder cream (hereinafter simply referred to as "solder") on the circuit substrate in parallel. The circuit substrate to be printed by an upstream one of the two printers 10 is supplied onto the substrate conveying and supporting device 38 and loaded from the in-conveyor 62 onto the main conveyor 60. The circuit substrate supported by the substrate support device 68 is brought into contact with the mask 44, and the printing device 36 prints the solder on the circuit substrate. After the printing, the circuit substrate is unloaded to the outconveyor 64 and moved from the outconveyor 64 to the movable conveyor 314 of the shuttle conveyor 310. The circuit substrate is then loaded from the movable conveyor 314 onto the pass-through substrate conveyor device 40 of a downstream one of the printer 10 and conveyed through the printer 10. The circuit substrate is then loaded onto a rear one of the conveyors 402 of the mounting machine 14 by the shuttle conveyor 310 mounted. on the downstream printer 10, and the electronic circuit components are mounted on the circuit substrate.

On the other hand, the circuit substrate to be printed by the downstream printer 10 is supplied onto the pass-through substrate conveyor device 40 of the upstream printer 10 and conveyed through the upstream printer 10. The circuit substrate is loaded onto the substrate conveying and supporting device 38 of the downstream printer 10 by the shuttle conveyor 310, and the solder is printed on the circuit substrate. The circuit substrate is then loaded onto a front one of the conveyors 402 of the mounting machine 14 by the shuttle conveyor 310, and the electronic circuit components are mounted on the circuit substrate.

In the present printer 10 as shown in FIG. 2, the main body portion 20 is normally retracted on the support table portion 22 by the retracting device 180 so as to be positioned at the backward-movement end position. Also, as shown in FIG. 6A, the clearance is formed between each of the protruding portions 156, 158 of the nut 154 and the engaging portion 160 of the support table portion 22. Thus, to perform operations such as the maintenance, the operator rotates the handle 152 to advance the main body portion 20 from the support table portion 22, but the feed screw 150 is not moved at first and the nut 154 is moved back with respect to the feed screw 150, causing the front protruding portion 156 to be engaged with the engaging portion 160 as shown in FIG. 6B. Thus, the clearance between the protruding portion 158 and the engaging portion 160 is made larger, which changes the signal of the sensor 202 from "OFF" to "ON", whereby it is detected that the main body portion 20 is to be advanced. The lever 188 is then pivoted to the retracted position to allow the advance of the main body portion 20, and when the handle 152 is rotated, the feed screw 150 is moved forward, so that the main body portion 20, as shown in FIG. 8, is advanced from the support table portion 22 together with the housing 366. The shuttle conveyor 310 is also advanced with the main body portion 20 so as to be moved frontward with respect to the support table portion 22.

This advance is guided by the guides 134, 138 and the engaging blocks 136, 140 with the reduced resistance of the movement. The operator can advance or draw the main body portion 20 to the forward-movement end position, but the engaging blocks 136 are provided on the rear end portion of the main body portion 20, the engaging blocks 140 are provided on the front end portion of the support table portion 22, and the guides 134, 138 corresponding to the respective blocks 136, 140 are respectively provided on the support table portion 22 and the main body portion 20. For this reason, a portion of the main body portion 20 which overlaps with the support table portion 22 is always supported stably at its four corners regardless of an amount of the advance from the support table portion 22.

The floor surface 26 is flat, and the wheel 210 is slightly distant from the floor surface 26 normally even in the advance and the retraction of the main body portion 20, but in a case where the main body portion 20 is slightly inclined by a downward force applied to the main body portion 20 in the state in which the main body portion 20 is advanced from the support table portion 22, the wheel 210 comes in contact with the floor surface 26 to prevent further inclination of the main body portion 20. If the floor surface 26 is not flat, and the wheel 210 comes in contact with the floor surface 26 due to its nonflatness, the springs 218 are compressed and the wheel 210 is rolled on the floor surface 26, allowing the forward and backward movement of the main body portion 20 in its horizontal posture. In view of the above, with the wheel 210 contacting the floor surface 26, the elastic member transfers at least a part of the weight of the main body portion 20 to the wheel 210.

Figure 6C:
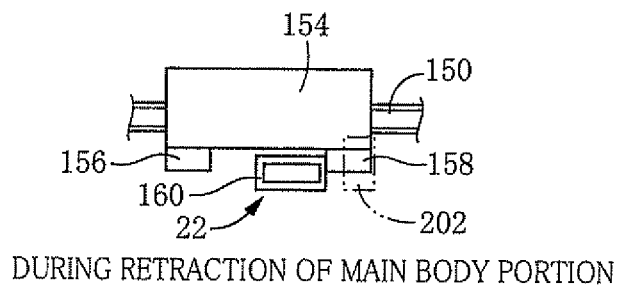

When returning the main body portion 20 onto the support table portion 22, the operator rotates the handle 152 in a direction reverse to that upon the advance. After the start of the operation, the feed screw 150 is not moved at first in its axial direction and the nut 154 is moved forward with respect to the feed screw 150, causing the rear protruding portion 158 to be engaged with the engaging portion 160 as shown in FIG. 6C. When the handle 152 is rotated further from this state, the feed screw 150 is moved backward and the main body portion 20 is retracted onto the support table portion 22 together with the housing 366. It is noted that the detection signal of the sensor 202 is changed from "ON" to "OFF" by this movement of the nut 154, but this change is ignored by the control device 300 and not used.

When the main-body-portion-side stopper portion 166 is detected by the sensor 200, the air cylinder 182 is activated to pivot the lever 188 to the operative position so as to automatically move the main body portion 20 to the backward-movement end position. In this operation, the nut 154 is moved rearward together with the feed screw 150 because the clearance, as shown in FIG. 6C, is present between the protruding portion 156 and the engaging portion 160. Thus, the feed screw 150 is moved rearward without being rotated, and the handle 152 is not rotated either. The clearance between the nut 154 and the engaging portion 160 is designed to be larger than a stroke through which the retracting device 180 moves the main body portion 20 backward to the backward-movement end position. This design allows the retracting device 180 to retract the main body portion 20 without the rotation of the feed screw 150. With the retraction of the main body portion 20, the shuttle conveyor 310 is also retracted to be returned to a position aligned with the support table portion 22.

Figure 9:
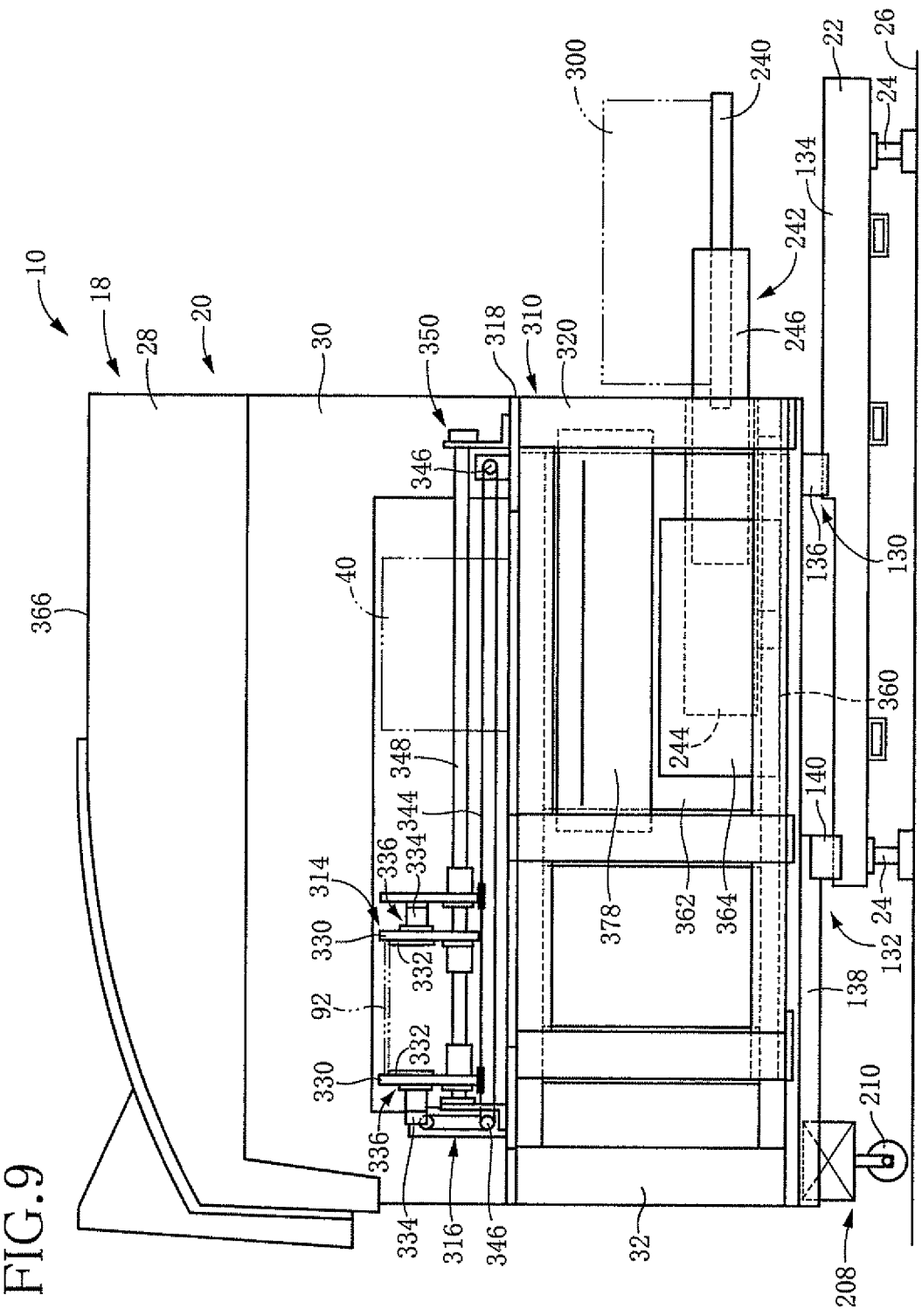
FIG. 9 is a side view showing a state in which the movable table is located at a maintenance position.

In the printer 10, the movable table 240 is normally positioned at an accommodating position shown in FIG. 8. When the main body portion 20 is advanced from the support table portion 22, a space is formed over a rear portion of the support table portion 22. Thus, as shown in FIG. 9, the operator can draw the movable table 240 to a maintenance position exposed at a rear of the main body portion 20, to perform the maintenance on the control device 300. Since the shuttle conveyor 310 is also moved to a space in front of the support table portion 22 together with the main body portion 20, a space is formed also at a rear of the shuttle conveyor 310, which does not interfere with the operator in entering the space formed at the rear of the main body portion 20.

When the movable table 240 is drawn from the main body portion 20, the rollers 264, 282 are rotated. As a result, the movable table 240 is moved smoothly, and the rollers 264 are rolled on the rail portions 254, causing the guides 246 to be moved rearward with respect to the guides 244. A peripheral speed of a top of each of the rollers 264 during its rolling is twice as fast as that of its rotation axis, and a distance of the movement of the guides 246 by the rolling of the rollers 264 is half a length of the movable table 240 on which is provided the rails 290 placed on top faces of the rollers 264. Thus, the guides 246 are moved backward with respect to the guides 244 by amounts each of which is half an amount of the drawing of the movable table 240. Therefore, as shown in FIG. 9, even in a state in which the movable table 240 and the guides 246 have been moved to their respective backward-movement end positions, the movable table 240 and the guides 246 are stably supported at their half portions in the front and rear direction by the respective guides 246, 244. Also, each rail 290 is sandwiched between the roller 284 of the guide 246 and the roller 264, preventing the movable table 240 from inclining rearward. In addition, each roller 280 is engaged with the engaging portion 256 of the guide 244, preventing the guide 246 from inclining rearward.

When moving the movable table 240 to the accommodating position, the operator presses the movable table 240 into the main body portion 20. Also in this case, the movable table 240 is moved forward by the rotations of the rollers 264, 282, and the guides 246 are moved forward with respect to the respective guides 244 by the rolling of the rollers 264, so that the movable table 240 is accommodated or retracted in the guides 244.

It is noted that since the space is formed at a rear of the main body portion by the advance of the main body portion from the support table portion, the printer and another machine can be provided back to back. As another machine, there may be a printer; a substrate working machine other than the printer such as a mounting machine, an adhesive applying machine, and a substrate inspection machine; or a machine other than the substrate working machine. For example, two lines each similar to the electronic-circuit assembly line shown in FIG. 1 are provided symmetrically with each other such that the printers are provided back to back and the mounting machines are provided back to back. Alternatively, the two electronic-circuit assembly lines may be provided in a state in which one of the lines is rotated 180 degrees such that the printer and the mounting machine are provided back to back. Where the electronic-circuit assembly lines are thus constructed, productivity is improved more.

The electronic-circuit assembly line may be a line including one printer.

Where at least one of the wheel device and the lift-preventing device is provided in the printer, the center of gravity of the main body portion can be located in front of the front end of the part of the support table portion, which part supports the main body portion, in the state in which the main body portion has been moved to the forward-movement end position defined by the stopper device with respect to the support table portion, whereby a maximum forward stroke of the main body portion can be increased. Where only the wheel device is provided, the wheel is provided so as to be always held in contact with the floor surface. Where only the lift-preventing device is provided, a center of gravity of a combination of the main body portion and the support table portion is located at a rear of a front end of a part of the support table portion, which part is held in contact with the floor surface. Where both of the devices are provided, the wheel is normally provided so as to be slightly distant from the floor surface, and in special situations, for example, if there is a clearance between components of the lift-preventing device, the wheel contacts the floor surface to prevent the main body portion from inclining forward, or if there is a protrusion on the floor surface, the wheel moves over this protrusion with the elastic member elastically deformed to keep the posture of the main body portion horizontal.

The printer may not include the pass-through substrate conveyor device. In such a printer, the shuttle conveyor is provided where needed, for example, where a device to which the circuit substrate printed with the printable material is supplied includes a plurality of substrate conveyor devices arranged parallel to one another.

Explanation of Reference Numerals

10: screen printing machine, 18: printer main body, 20: main body portion, 22: support table portion, 120: manual drive device, 122: resistance reducing device, 240: movable table, 242: movable-table support device, 310: shuttle conveyor

The invention claimed is:

1. A screen printing machine comprising:
   a substrate conveying and supporting device configured to convey a circuit substrate in a right and left direction and position and support the circuit substrate at a printing position;
   a printing device configured to carry out screen printing on the circuit substrate supported by the substrate conveying and supporting device;
   a printer main body configured to hold the substrate conveying and supporting device and the printing device, the printer main body including:
      a main body portion and
      a support table portion which are provided independently of each other, and the main body portion is supported by the support table portion so as to be movable forward;
   a stopper device configured to define a forward-movement end position of the main body portion with respect to the support table portion; and
   a lift-preventing device configured to prevent at least a rear portion of the main body portion from being lifted upward from the support table portion,
   wherein:
      in a state in which the main body portion has been moved to the forward-movement end position defined by the stopper device with respect to the support table portion, a center of gravity of the main body portion is located at a rear of a front end of a part of the support table portion, which part supports the main body portion, and
      in a state in which the main body portion has been moved to the forward-movement end position defined by the stopper device with respect to the support table portion, a center of gravity of a combination of the main body portion and the support table portion is located at a rear of a front end of a part of the support table portion, which is held in contact with the floor surface.

2. The screen printing machine according to claim 1,
   wherein a resistance reducing device is provided between the main body portion and the support table portion to reduce resistance of the movement of the main body portion relative to the support table portion, and
   wherein the resistance reducing device comprises:
   a first resistance-reducing portion including: a first guide fixed to the support table portion so as to be parallel to a front and rear direction; and a first engaging block provided on a rear end portion of the main body portion and engaged with the first guide so as to be movable relative to the first guide in the front and rear direction; and
   a second resistance-reducing portion including: a second guide fixed to the main body portion so as to be parallel to the front and rear direction; and a second engaging block provided on a front end portion of the support table portion and engaged with the second guide so as to be movable relative to the second guide in the front and rear direction.

3. The screen printing machine according to claim 2, further comprising:
   a movable member configured to support at least a portion of a device of the screen printing machine, the device being disposed in the main body portion; and
   a movable-member support device configured to support the movable member such that the movable member is movable selectively at one of: an accommodating position at which the movable member is located in the main body portion; and a maintenance position at which the movable member is exposed at a rear of the main body portion.

4. The screen printing machine according to claim 3, wherein the movable-member support device includes:
   a third guide provided in the main body portion so as to be parallel to the front and rear direction;
   a fourth guide held by the third guide so as to be movable relative to the third guide in the front and rear direction, the fourth guide holding the movable member such that the movable member is movable relative to the fourth guide in the front and rear direction; and
   a fourth-guide moving device configured, when the movable member is drawn to the rear of the main body portion, to move the fourth guide backward with respect to the third guide through a stroke that is less than a drawing stroke of the movable member.

5. The screen printing machine according to claim 1, the stopper device being further configured to define a backward-movement end position of the main portion of the main body portion with respect to the support table portion, the screen printing machine further comprising:
   a manual drive device including: (a) a feed screw rotatably held by the main body portion so as to be parallel to the front and rear direction; (b) a handle operable to be rotated to rotate the feed screw; and (c) a nut held by the support table portion so as to be unrotatable and engaged with the feed screw, the manual drive device being configured to move the main body portion forward and backward in the front and rear direction with respect to the support table portion with a rotating operation for the handle; and a power driving device including an actuator operable by power, the power driving device being configured to move the main body portion backward with respect to the support table portion based on an actuation force of the actuator until the backward movement is stopped by the stopper device;

wherein a clearance is formed between the nut and the support table portion so as to allow, without the rotation of the feed screw, the relative movement for a distance that is greater than a stroke through which the main body portion is moved backward by the power driving device.

6. The screen printing machine according to claim 1, wherein a shuttle conveyor is mounted on at least one of an upstream side and a downstream side of the main body portion of the printer main body, the shuttle conveyor including (a) a movable conveyor configured to perform passing of the circuit substrate with the substrate conveying and supporting device and movable in a direction perpendicular to a direction in which the substrate conveying and supporting device conveys the circuit substrate and (b) a conveyor moving device configured to move the movable conveyor, the shuttle conveyor being movable forward with respect to the support table portion together with the main body portion.

7. A screen printing machine comprising:

a substrate conveying and supporting device configured to convey a circuit substrate in a right and left direction and position and support the circuit substrate at a printing position;

a printing device configured to carry out screen printing on the circuit substrate supported by the substrate conveying and supporting device;

a printer main body configured to hold the substrate conveying and supporting device and the printing device, the printer main body including: a main body portion, and a support table portion which are provided independently of each other, and the main body portion is supported by the support table portion so as to be movable forward;

a manual drive device including:

a feed screw rotatably held by the main body portion so as to be parallel to the front and rear direction;

a handle operable to be rotated to rotate the feed screw; and a nut held by the support table portion so as to be unrotatable and engaged with the feed screw, the manual drive device being configured to move the main body portion forward and backward in the front and rear direction with respect to the support table portion with a rotating operation for the handle;

a stopper device configured to define a backward-movement end position of the main body portion with respect to the support table portion; and a power driving device including an actuator operable by power, the power driving device being configured to move the main body portion backward with respect to the support table portion based on an actuation force of the actuator until the backward movement is stopped by the stopper device, wherein a clearance is formed between the nut and the support table portion so as to allow, without rotation of the feed screw, the relative movement for a distance that is greater than a stroke through which the main body portion is moved backward by the power driving device.

* * * * *